US005589083A

United States Patent [19]
Ahn et al.

[11] Patent Number: 5,589,083
[45] Date of Patent: Dec. 31, 1996

[54] METHOD OF MANUFACTURING MICROSTRUCTURE BY THE ANISOTROPIC ETCHING AND BONDING OF SUBSTRATES

[75] Inventors: Kun-Young Ahn; Kyung-Ho Park; Kee-Soo Nam; Sang-Won Kang, all of Daejeon, Rep. of Korea

[73] Assignee: Electronics and Telecommunications Research Institute, Daejeon-Shi, Rep. of Korea

[21] Appl. No.: 346,205

[22] Filed: Nov. 22, 1994

[30] Foreign Application Priority Data

Dec. 11, 1993 [KR] Rep. of Korea ................. 93-27344
Dec. 18, 1993 [KR] Rep. of Korea ................. 93-28479
Dec. 18, 1993 [KR] Rep. of Korea ................. 93-28480

[51] Int. Cl.$^6$ ............................. H01L 21/00; B44C 1/22
[52] U.S. Cl. .................. 216/24; 156/633.1; 156/647.1; 156/657.1; 216/2; 216/33; 216/41
[58] Field of Search ............................ 156/628.1, 633.1, 156/647.1, 657.1, 659.11, 662.1, 649.1, 636.1, 653.1; 216/2, 24, 33, 41, 88, 11, 27

[56] References Cited

U.S. PATENT DOCUMENTS

| | | | |
|---|---|---|---|
| 3,332,137 | 7/1967 | Kenney | 29/423 |
| 3,783,218 | 1/1974 | Adams et al. | 219/10.53 |
| 3,844,858 | 10/1974 | Bean | 156/647.1 X |
| 4,056,413 | 11/1977 | Yoshimura | 156/647.1 X |
| 5,017,263 | 5/1991 | Clark | 156/633.1 |

FOREIGN PATENT DOCUMENTS 0161740  11/1985  European Pat. Off. .

*Primary Examiner*—William Powell
*Attorney, Agent, or Firm*—Larson and Taylor

[57] ABSTRACT

The present invention relates to a method of manufacturing microstructure by the anisotropic etching and bonding of substrates so as to manufacture mechanically functioning micro-structures in various forms by uniting the same or different substrate bonding technique and selective anisotropic etching technique. This invention manufactures a pyramidal optical divider or an optical divider with a pyramidal structure located on a quadrilateral pillar by bonding one substrate on a substrate different in the direction of crystallization and anisotropically etching them thereafter. This invention manufactures variously shaped nozzles by bonding those substrates crystallized in a different direction and anisotropically etching them so that substrates bonded by one photograph transferring process may form different etching holes. This invention manufactures a diaphragm having a uniform thickness and a wide area by bonding two substrates different in the direction of crystallization or in the concentration of an impurity, removing a substrate of prescribed concentration and anisotropically etching only one substrate of the remaining substrates.

17 Claims, 18 Drawing Sheets

METHOD OF MANUFACTURING MICROSTRUCTURE BY THE ANISOTROPIC ETCHING AND BONDING OF SUBSTRATES

BACKGROUND OF THE INVENTION

1. Field of the Invention

This invention relates to a method of manufacturing microstructures by the anisotropic etching and bonding of substrates so as to manufacture an optical divider, an ink jet nozzle or a diaphragm variously by bonding silicon substrates different in the direction of crystallization and anisotropically etching those substrates properly using an etching solution which changes in etching characteristic according to the direction of crystallization.

2. Description of the Prior Art

Generally speaking, a silicon substrate is not only used typically to manufacture an electric element but also used widely to manufacture microstructure.

In the case where a semiconductor integrated circuit or a small mechanical structure is manufactured on a silicon substrate, silicon substrate bonding technique and anisotropical etching technique are used widely. The silicon substrate bonding technique is an art by means of which a number of silicon substrates are made into a sheet of substrate by bonding them after going through a properly pre-treating process. A process of making a silicon substrate hydrophillic, which is a pre-treating process, is performed by soaking it in a solution in which sulfuric acid and hydrogen peroxide are mixed in the ratio of 1 to 4.

The silicon substrates which have gone through the pre-treating process are bonded under atmospheric pressure at the room temperature after mirror surfaces are made to face each other. At this time, these two substrates are heat-treated for about 1 hour in an oxidizing atmosphere usually at the temperature above 900° C. to increase their bonding strength. When two substrates are bonded, those parts which are not bonded are caused by those particles interposed between the substrates, the flatness of the substrates or gas kept between the substrates, and so bonding must be conducted only in the same place to impose an effective check on it.

Bonding of substrates is finished if it is done in this way. As needs arise, substrates can be bonded after an oxidized film is formed on the surface of one substrate or after polycrystalline silicon is deposited thereon.

As the direction of silicon crystallization produces no effect on the bonding of substrates, silicon substrates crystallized either in the same direction or in a different direction can be bonded.

Examining those prior patent materials which made mention of such substrate bonding technique, the Japanese patent 61-182239 (A device for bonding of semiconductor substrates) refers to "a device designed to cause two substrates to achieve early bonding only at one point in order to prevent occurrence of a part which is not bonded due to gas kept between them when they are bonded" and the U.S. Pat. No. 3,332,137 (A method of insulating semiconductor material substrates) refers to "a method of insulating each range by etching bonded substrates formed of n type and p type layers in a vertical direction" and No. 3783218 (A method of bonding substrates electrostatically) refers to "a method of bonding substrates by applying electric field to lower the substrate bonding temperature".

In the European patent No. 0161740 (A method of manufacturing a semiconductor substrate), there are mentioned "technique of bonding substrates with n type and p type ranges manufactured vertically and technique of bonding substrates after manufacturing channels and structures thereon".

However, those techniques mentioned in the prior patent materials are useful only when substrates are bonded for manufacturing an element which functions electrically. No reference was made to bonding of substrates for manufacturing mechanical functioning structures such as a diaphragm, an optical divider and a nozzle. Reference was made only to isotropic etching of bonded silicon substrates.

Touching on a paper on bonded silicon substrates, technique of bonding the substrates crystallized in the same direction of <100>/<100> and <111>/<111> and bonding the substrates crystallized in a different direction of <100>/<111>, valuation of the physical properties of bonded interface and valuation of the properties of electric current-voltage by manufacturing a diode are mentioned in pages 533–536, 18th SSDM (1986), Ext, Abs. "Lattice configuration and electrical properties at the interface of direct bonded silicon" of K. Furukawa.

However, this paper limits the kinds of substrates to be bonded to <100> and <111>, making reference only to bonding of substrates for manufacturing an electrically functioning element.

Now, anisotropic silicon etching technique will be described. A peculiarity of wet etching varies with the crystallized direction of a silicon substrate and the concentration of an impurity, and so variously shaped structures can be manufactured if it is utilized. Solutions generally used for etching include a mixed solution of fluoric acid-nitric acid-acetic acid, a solution of EDP (ethylene diamine pyrocathecol) and a solution of KOH.

As to the mixed solution of fluoric acid-nitric acid-acetic acid, etching speed can be adjusted according to its ratio of composition. When it is in the ratio of specific composition (1-3-8), a $p^+$ substrate is faster than a $p^-$ substrate by about 150 times in etching speed, and so only the $p^-$ range can be left by selectively removing only the $p^+$ range. This solution is an isotropic etching solution which effects etching at the same speed for all crystallization directions in any composition. The solution of EDP changes in etching characteristic according to the concentration of an impurity and the direction of crystallization and scarcely etches an oxidized film, and so the oxidized film can be used as an etching protective film. Therefore, only the $p^-$ range can be removed selectively and the etching selection ratio of the surface can be made different according to the direction of crystallization.

The solution of KOH is an anisotropic etching solution which changes in etching characteristic according to the crystallization direction of silicon. In the direction of <100>, etching is effected faster than the direction of <111> by about 400 times. The solution of KOH is most safe and convenient for use but etches an oxidized film. In the case of etching for many hours, a nitride film is used as an etching protective mask.

FIG. 1 is a sectional view of a characteristic in the case where a silicon substrate crystallized in the direction of <100> is anisotropically etched. An oxide film or a nitride film is applied to the silicon substrate crystallized in the direction of <100> as an etching protective mask (102) and an etching window (103) is made only in a part to be etched (refer to FIG. 1(*b*)). When etching proceeds by means of an anisotropic etching solution like KOH and EDP, <111> surface (105) is exposed. In the <111> direction, etching is delayed as compared with <100> direction. Accordingly, as etching proceeds, a side <111> area increases and, when four sides meet at one point, it assumes the form of a pyramid (104) and etching is thereby finished (refer to FIG. 1(c)). At this time, the angle of side and substrate surface is 54.7° and the maximum depth of etched range is determined by the size of the etching window (103).

FIG. 2 is a sectional view of a characteristic in the case where a silicon substrate crystallized in the direction of <410> is anisotropically etched. An oxide film or a nitride film is applied to the silicon substrate crystallized in the of <410> as an etching protective mask (202) and an etching window (203) is made only in a part to be etched (refer to (b) of FIG. 2). When etching proceeds by means of an anisotropic etching solution like KOH and EDP, <111> surface (205) is exposed. In the <111> direction, etching is delayed as compared with <410> direction. Consequently, as etching proceeds, <111> surface (205) is exposed on the side and etched area decreases. When four sides meet at one point, it assumes the form of a pyramid (204) and etching is thereby finished. (refer to (c) of FIG. 2). At this time, the angle of side and substrate surface is 45.6°.

FIG. 3 is a sectional view of a characteristic in the case where a silicon substrate crystallized in the direction of <110> is anisotropically etched. An oxide film or a nitride film is applied to a silicon substrate (301) crystallized in the <110> direction as shown in (a) of FIG. 3 as an etching protective mask (302) and an etching window (303) is made only in a part to be etched (refer to (b) of FIG. 3).

When etching proceeds by means of an anisotropic etching solution like KOH and EDP, <111> surface (306) appears on the side at an angle of 90° with the substrate surface and etching to the side is not effected any more. In the bottom (305) of etched part, etching continues to proceed to the <110> surface, and so it assumes the form of an etching square pillar (304) surrounded by four sides (306) in the <111> direction and etching is thereby finished (refer to (c) of FIG. 3).

Therefore, the maximum depth of an etched range is determined simply by etching time regardless of the size of the etching window (303).

Examining those papers which are related to the aforesaid anisotropic etching technique, there is mentioned optical waveguide manufacturing technique by the anisotropic etching and bonding of silicon substrates in pages 508–509, Electronic Letters 21 (1985), "silicon optical PCB for 3-D integrated optics". of Y. Kokubum. In pages 1321–1327, J. Electrochem. Soc. "The fabrication of high precision nozzle by the anisotropic etching of <100> silicon." of E. Bassous, there is mentioned technique of manufacturing ink jet nozzles by etching a <100> silicon substrate with a solution of EDP.

And, in "A micromachined biomedical pressure sensor with fiberotic interferometric readout", Proc. 7th Int'l Confon Solid-State Sensors and Actuators, there is mentioned "technique of etching structure having a side face at an angle of 45° with the plane of a substrate".

According to those papers, however, in the case where microstructures assuming complicated forms on a silicon substrate are manufactured, a method of manufacturing each part severally on an individual substrate and then uniting said each part is used. As this method requires an individual photograph transferring process and etching process for every substrate, it is troublesome to perform the aforesaid processes as many times as the number of substrates and microstructure are apt to change their shapes or suffer a damage in the process of uniting the manufactured microstructure.

According to those papers, the shape of an ink jet nozzle comprises four simply shaped inclined planes making an angle of 54° with the surface of a substrate and an optical reflective surface is also made of a surface which sank at an angle of 54 degrees or 45 degrees with the surface of the substrate.

As the substrate is anisotropically etched in such a simple way, an optical divider indispensable when a nozzle or a light signal is treated can not be manufactured in a fine and miniaturized form and the accuracy of a position is also lowered, not to mention that the structure is not properly applicable.

As a sensor provided with a sensing part which reacts mechanically and a peripheral circuit part which processes a signal from the sensing part on a signal chip by the use of a silicon substrate is developed recently, a growing interest is taken therein.

In the case of a pressure sensor, the sensitivity of a sensing part is proportional to the square of the length of one side of a diaphragm and inversely proportional to the square of thickness. Therefore, in the case where the aforesaid sensor is manufactured, it is important to manufacture a diaphragm which is thin and uniform in thickness and wide in area as far as possible.

FIG. 4 is a sectional view of a process in the case where a diaphragm is manufactured. A diaphragm (403) is manufactured (refer to b of FIG. 4) by forming an etching protective mask (402) on one surface of a substrate (401) like (a) of FIG. 4 and conducting etching therein.

FIG. 5 is a sectional view of a process in the case where a diaphragm is manufactured in bonded substrates crystallized in the same direction with an epitaxial layer interposed therein. In the first place, a p⁻ substrate (503) is bonded to the lower part of a p⁺ substrate (501) with a p⁻ epitaxial layer (502) formed (refer to (a)(b)(c) of FIG. 5). When only the p⁺ substrate (501) is etched by means of an etching solution which effects etching selectively according to the concentration of an impurity, for example, a mixed solution of fluoric acid-nitric acid-acetic acid, the p⁻ epitaxial layer is left on the p⁻ substrate (503).

In such a condition, a diaphragm (504) is manufactured by etching the p⁻ substrate (503). The thickness of a thin film diaphragm in the process of FIG. 4 and FIG. 5 is determined simply by the etching time of a final substrate, and so it offers a problem in the uniformity and reproducibility of the thickness of the diaphragm.

SUMMARY OF THE INVENTION

It is an object of the present invention is to provide a method of manufacturing microstructure by anisotropic etching and bonding of substrates so as to manufacture those micro-structures which shorten a photograph transferring process but possess a mechanical function in various shapes by uniting the same or different substrate bonding technique and selective anisotropic etching technique.

Another object of the present invention is to provide a method of manufacturing microstructure by the anisotropic etching and bonding of substrates so as to easily manufacture an optical divider and an ink jet nozzle which are miniaturized and excellent in the accuracy of a position and in the reproducibility of a shape.

Still another object of the present invention is to provide a method of manufacturing microstructure by the anisotropic etching and bonding of substrates so as to manufacture a thin film diaphragm to a uniform thickness in the wide area when a sensor is manufactured.

Further another object of the present invention is to provide a method of manufacturing microstructure by the anisotropic etching and bonding of substrates so as to prevent transformation and damage of the microstructure by eliminating a parts-uniting process through the manufacture of each part in consecutive order using bonded substrates in which more two substrates are bonded when the microstructure is manufactured.

DETAILED DESCRIPTION OF THE INVENTION

Embodiments of the present invention will now be described in detail by referring to FIGS. 6 to 14 attached hereto.

The first embodiment of the present invention relates to manufacturing an optical divider which sends out one light by separating it in several directions.

The optical divider is an important element in optical communication. It is very useful even for processing an optical signal on a substrate or on a circuit.

Figure 1A:
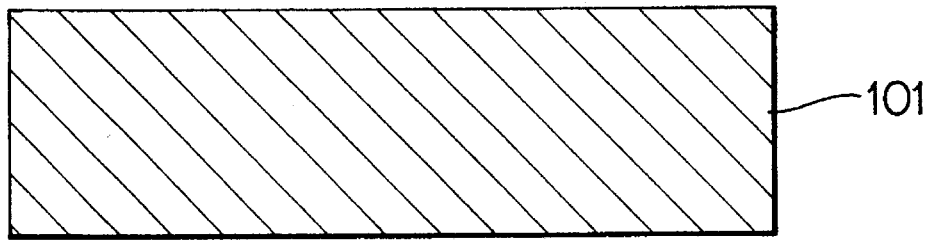
FIGS. 1(a) through 1(c) are prior art sectional views of a characteristic in the case where a silicon substrate crystallized in the direction of <100> is anisotropically etched.
Figure 1B:
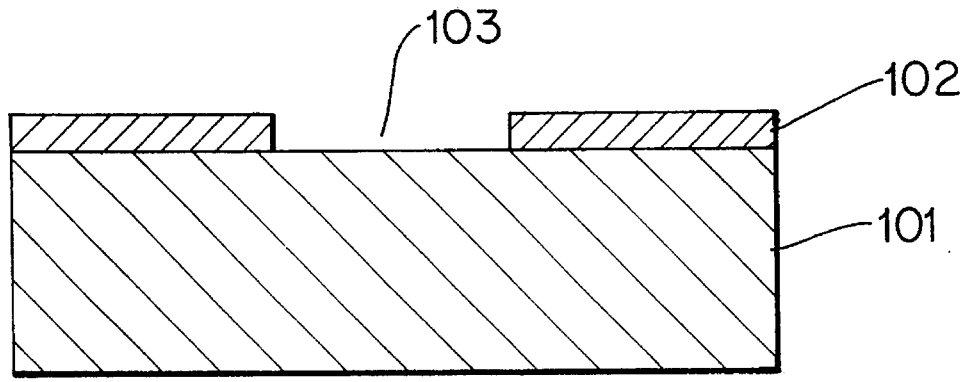
Figure 1C:
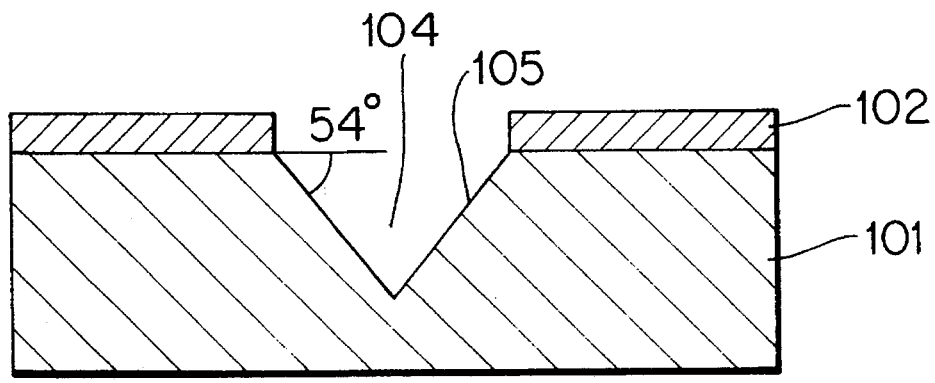
Figure 2A:
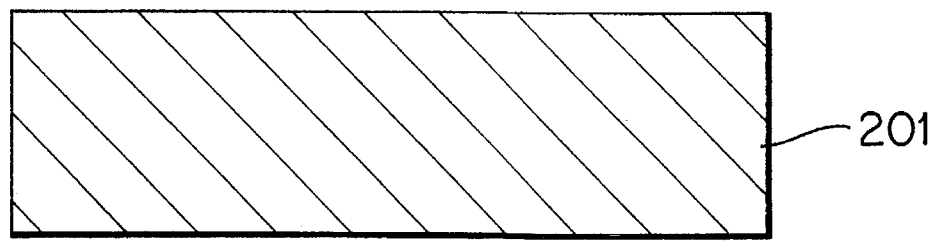
FIGS. 2(a) through 2(c) are prior art sectional views of a characteristic in the case where a silicon substrate crystallized in the direction of <410> is anisotropically etched.
Figure 2B:
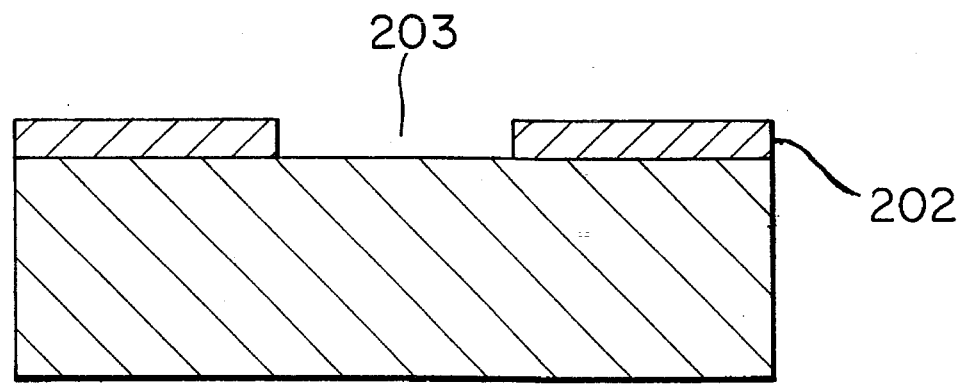
Figure 2C:
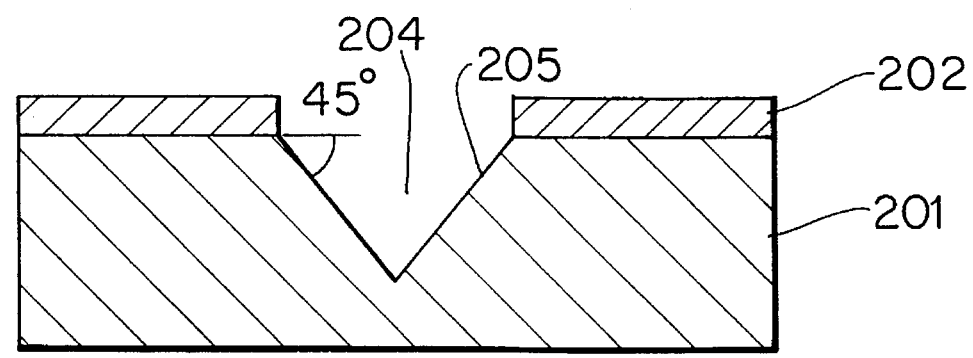
Figure 3A:
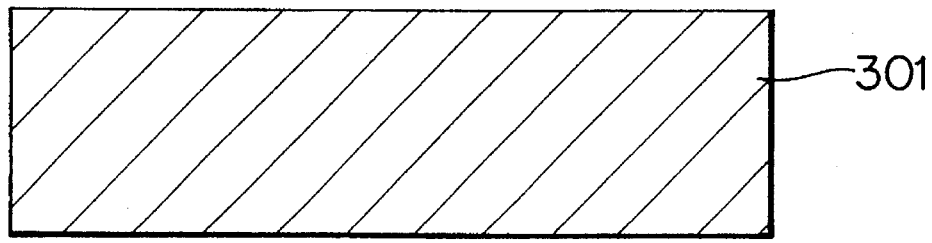
FIGS. 3(a) through 3(c) are prior art sectional views of a characteristic in the case where a silicon substrate crystallized in the direction of <110> is anisotropically etched.
Figure 3B:
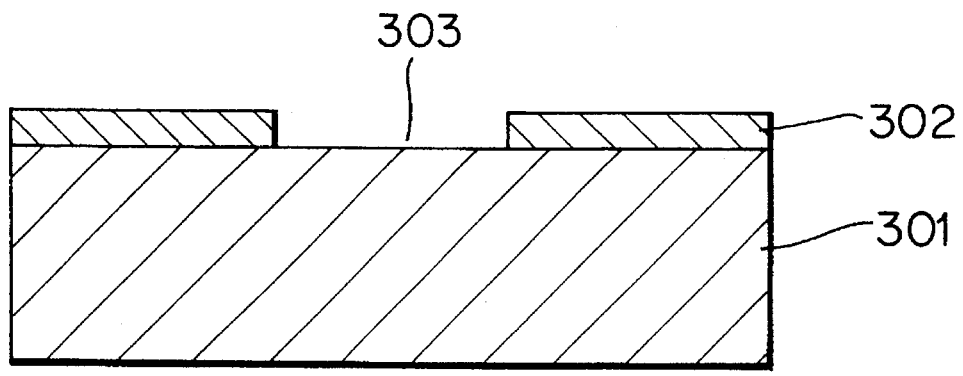
Figure 3C:
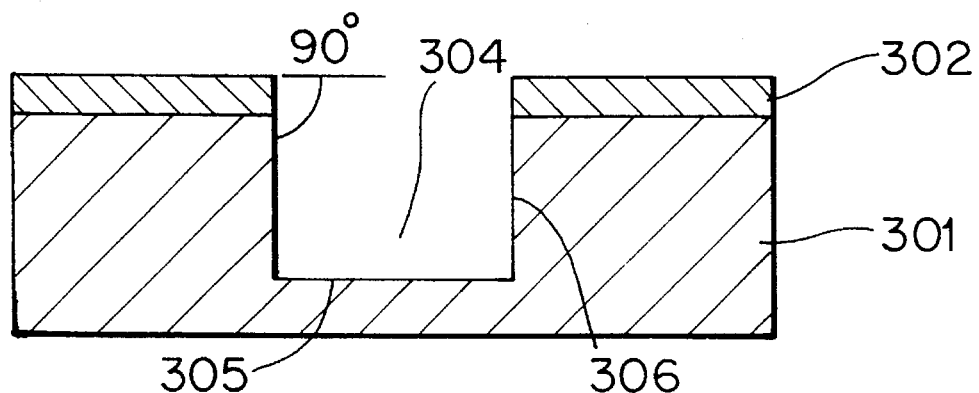
Figure 4A:
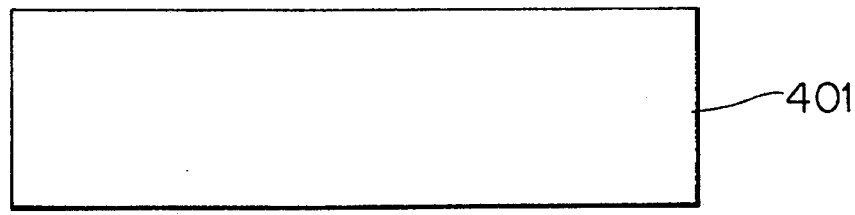
FIGS. 4(a) through 4(b) are prior art sectional views of a process in the case where a diaphragm is manufactured in bonded substrates crystallized in the same direction.
Figure 4B:
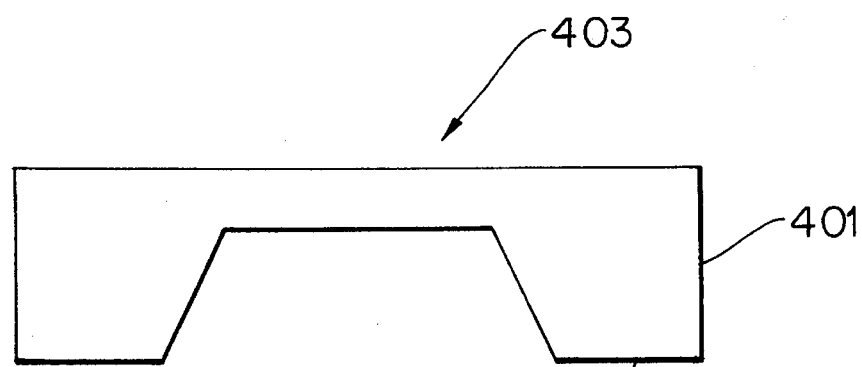
Figure 6:
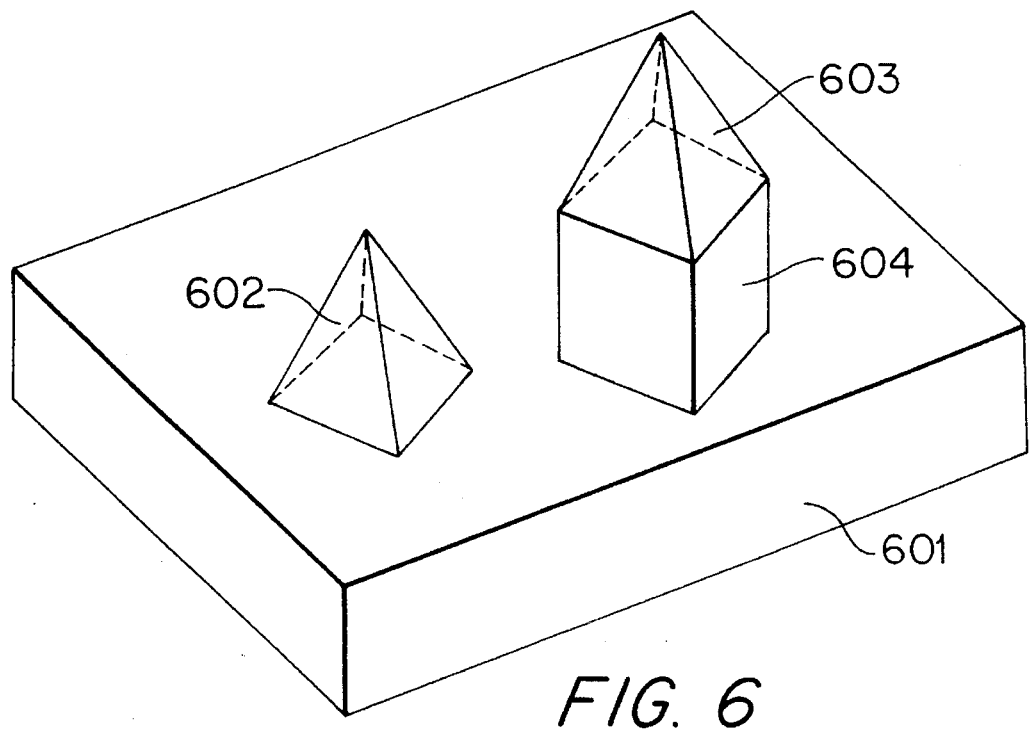
FIG. 6 is an illustrative view roughly showing the shape of an optical divider intended for embodiment in the present invention.
Figure 5A:
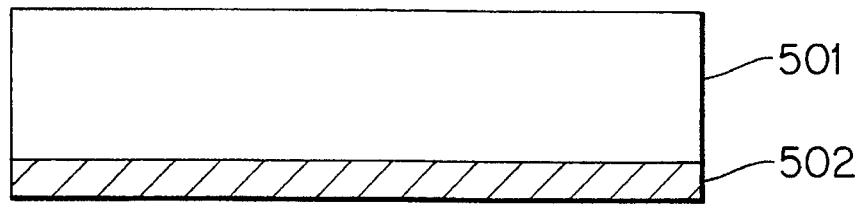
FIGS. 5(a) and 5(d) are prior art sectional views of a process in the case where a diaphragm is manufactured in bonded substrates crystallized in the same direction with an eptaxial layer interposed therein.
Figure 5B:
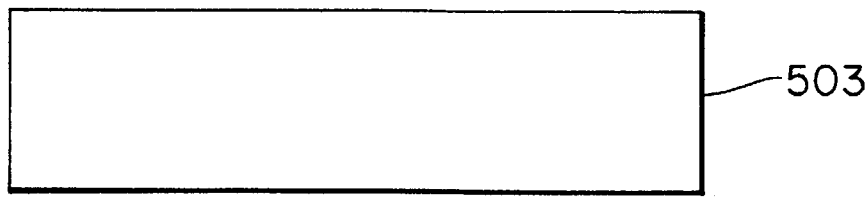
Figure 5C:
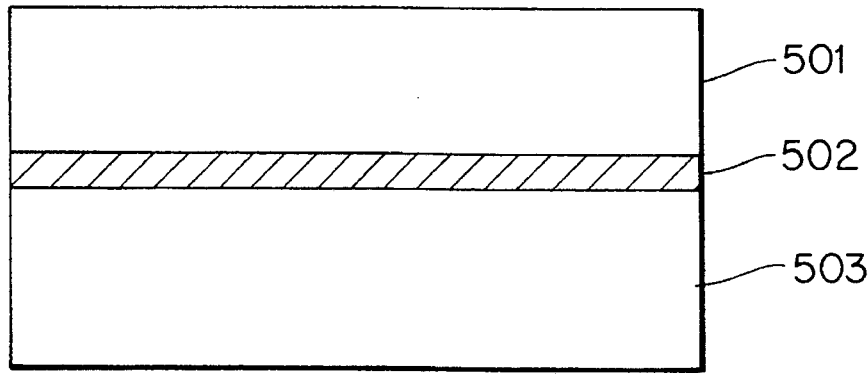
Figure 5D:
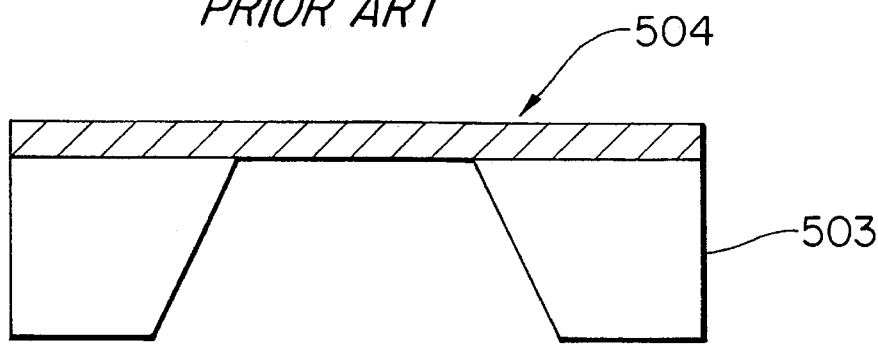

FIG. 6 is an illustrative view roughly showing the shape of an optical divider intended for embodiment in the present invention, the optical divider having four optical reflective surfaces.

When an optical signal comes into the upper apexes of pyramidal optical dividers (602) (603) having four optical reflective surfaces, the optical signal is separated into four in the optical divider and transmitted in each direction.

The number of optical reflective surfaces and an angle formed by the optical reflective surfaces with a substrate (601) are determined by an etching solution to be used and the direction of the substrate crystallization. For example, if an angle to be formed by the optical reflective surfaces with the substrate is intended to be 54.7°, the <100> substrate is etched, and if the angle is to be 45°, the <410> substrate is etched by an anisotropic etching solution like KOH or EDP.

When a <100> substrate is used, optical reflective surfaces form an angle 54.7° with it, and so a reflected optical signal does not proceed in parallel with the substrate and touches the substrate at a certain distance.

When a <410> substrate is used, optical reflective surfaces form an angle of 45° with it, and so a reflected optical signal proceeds in parallel with the substrate.

In order to change the distance between the separated optical signal and the substrate, it will do if the optical divider is positioned on the pillar structure and the height of the pillar structure is changed.

As shown is FIG. 6, the optical divider (603) is situated on the pillar structure, and so the distance between the divided light and the substrate is changeable if the height of the pillar structure is changed.

The four optical reflective surfaces for optical division in the present invention are manufactured by the anisotropic etching of a substrate. In other words, an angle of each surface with the bottom is determined by the direction of crystallization of a substrate which is etched anisotropically. For example, if a <100> substrate was etched anisotropically, the surface of a mirror forms an angle of 54.7° with the bottom and, if a <410> substrate was etched anisotropically, the surface of the mirror forms an angle of 45.56 with the bottom.

FIG. 7 is a sectional view showing a process of manufacturing an optical divider which forms an angle of 45° with the bottom and has no pillar structure. In the first plane, a <410> substrate (701) like (a) of FIG. 7 is chosen and an etching window (703) is made with a nitride film or an oxide film as an etching protective mask (702) as shown in (b) of FIG. 7.

When the <410> substrate (701) is etched anisotropically with a solution of KOH or EDP. a <111> surface (705) which forms an angle of 45.56° with the bottom is exposed on the side and etching is finished while a pyramidal etching hole (704) is formed (refer to (c of FIG. 7).

Figure 7A:
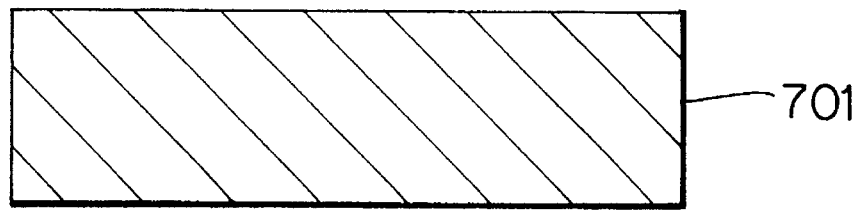
FIGS. 7(a) through 7(g) are sectional views showing a process of manufacturing an optical divider which forms an angle of 45 degrees with the bottom and has no pillar structure.
Figure 7B:
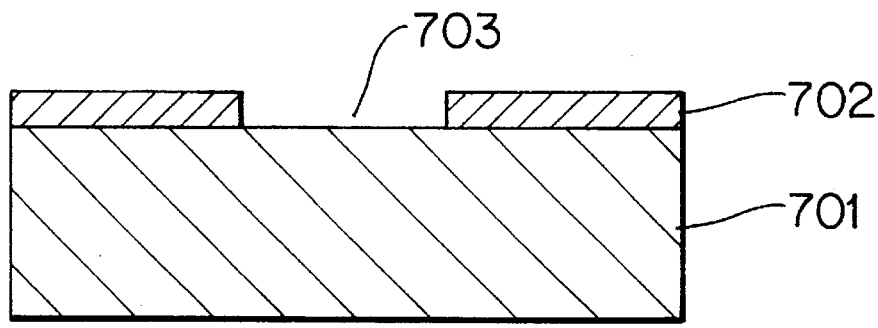
Figure 7C:
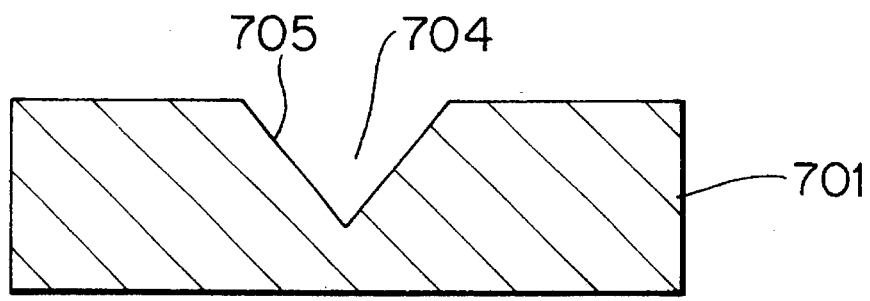
Figure 7D:
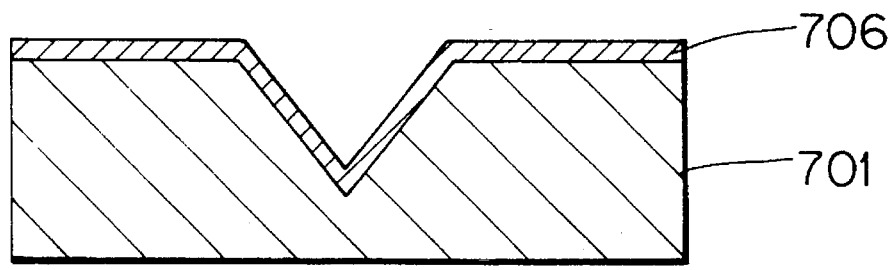
Figure 7E:
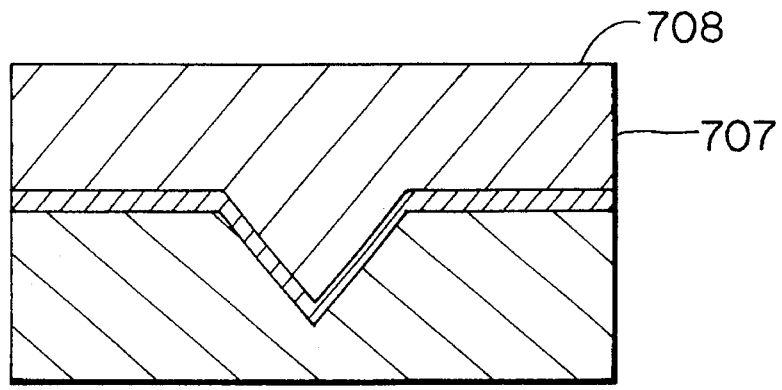

As shown in (d) of FIG. 7, when needs arise, a proper optical reflective layer (706) is formed and a deposited layer (707) like polycrystalline silicon or an oxidized film is formed to fill up the etching hole (704) and a flat surface (708) is manufactured for bonding of substrates by removing unevenness on the surface (refer to FIG. 7(e)).

Figure 7F:
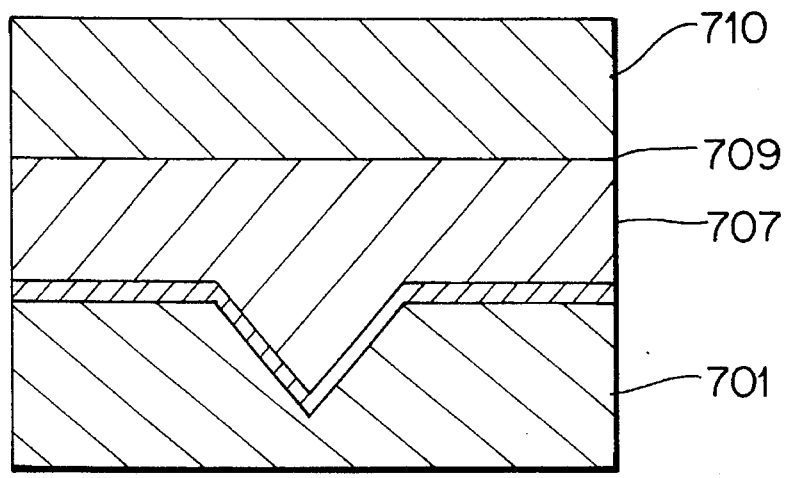
Figure 7G:
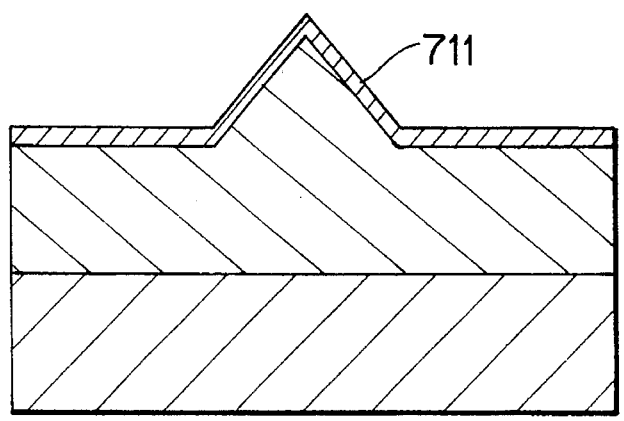
Figure 8A:
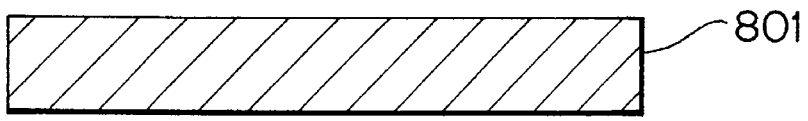
FIGS. 8(a) through 8(k) are sectional views showing a process of manufacturing an optical divider which can change the distance between an optical reflective surface and a substrate at its discretion by positioning it at the and of a pillar.
Figure 8B:
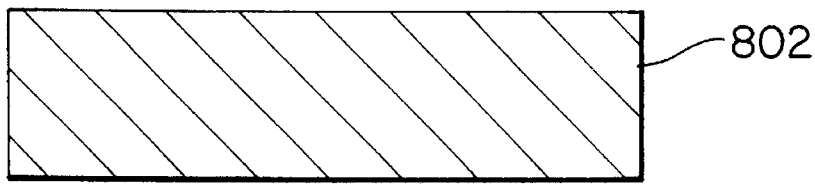
Figure 8C:
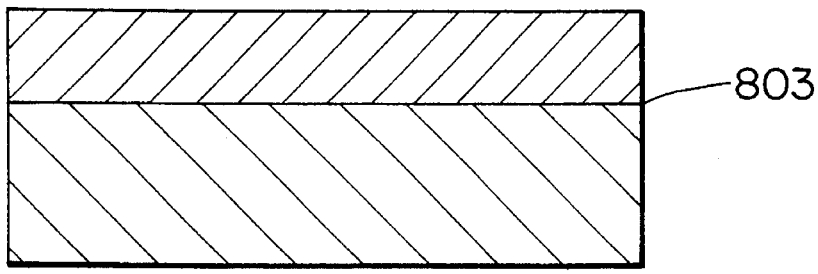
Figure 8D:
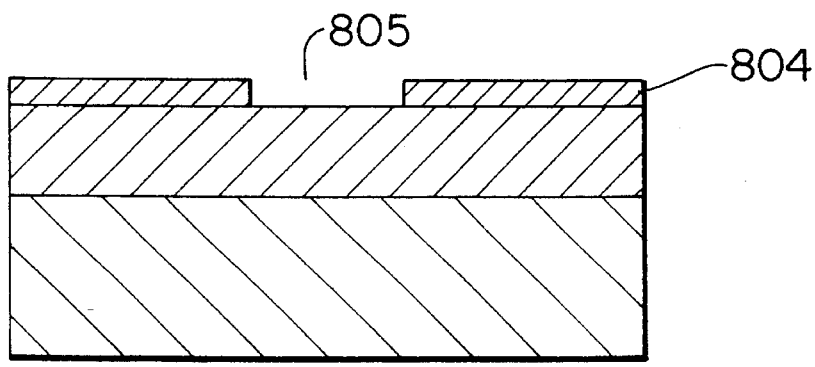
Figure 8E:
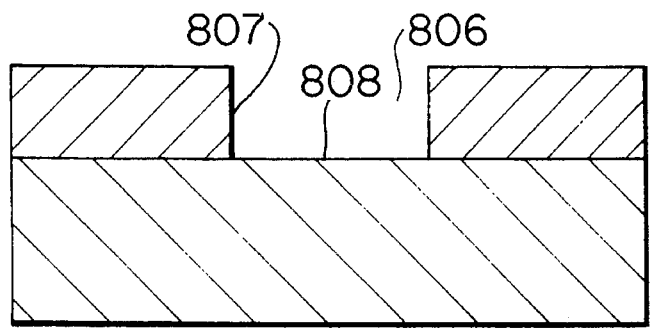
Figure 8F:
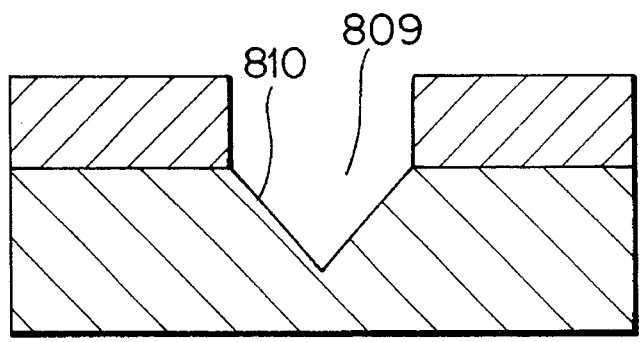
Figure 8G:
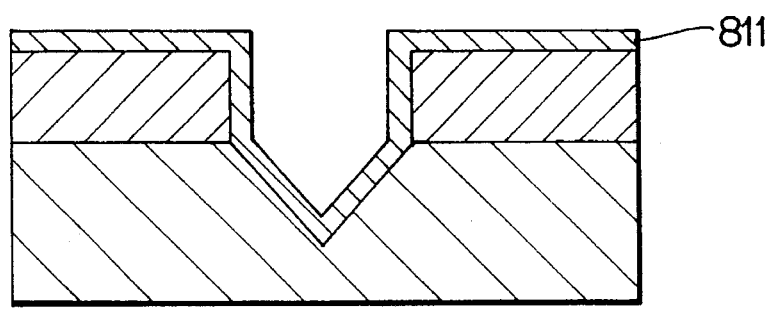
Figure 8H:
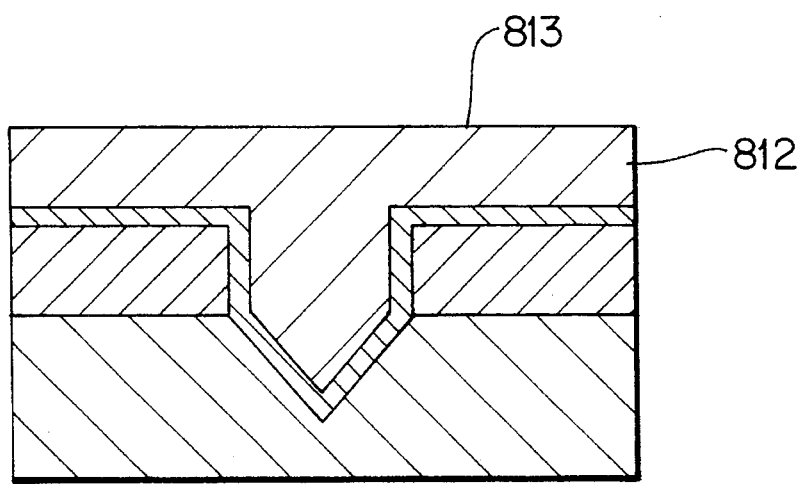
Figure 8I:
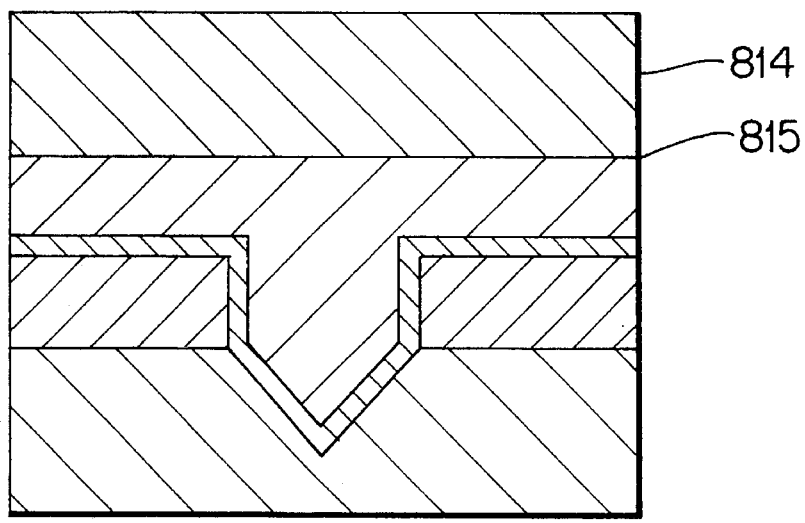
Figure 8J:
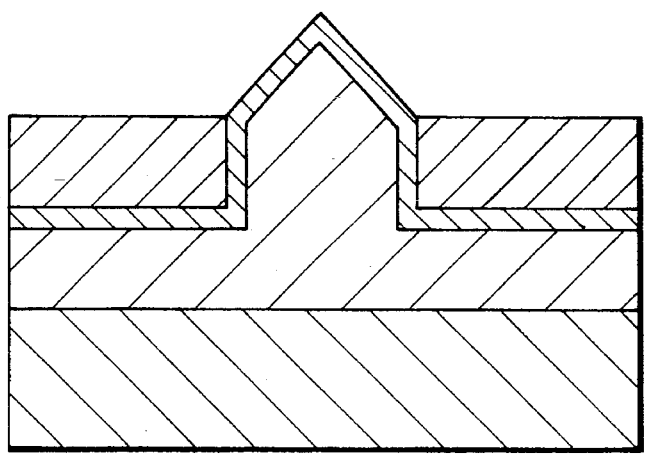
Figure 8K:
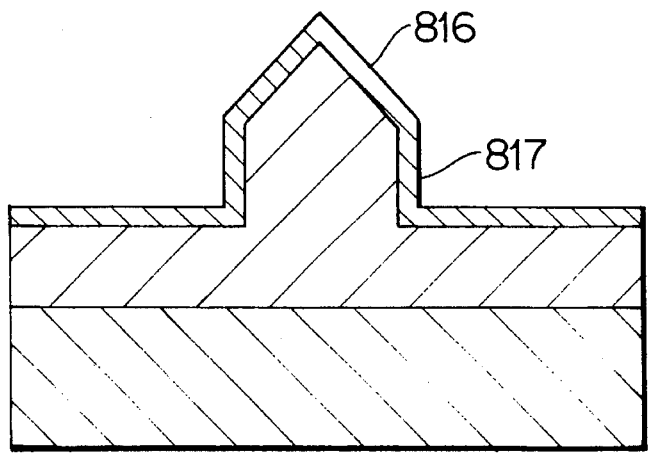
Figure 9A:
FIGS. 9(a) through 9(g) are sectional views of a process in the case where a nozzle which has an inclined plane and a vertical plane is manufactured.
Figure 9B:
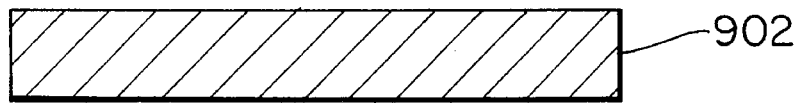
Figure 9C:
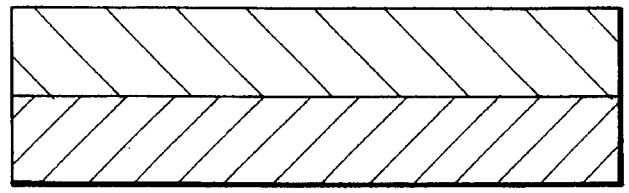
Figure 9D:
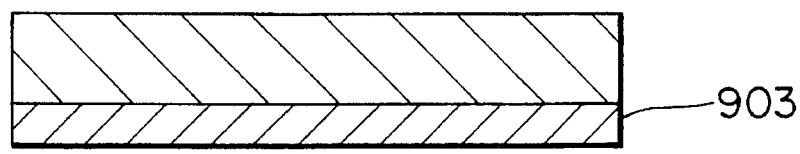
Figure 9E:
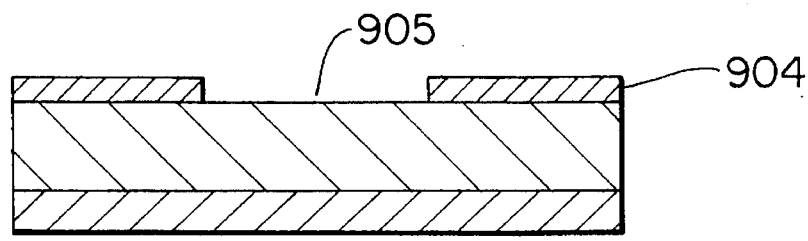
Figure 9F:
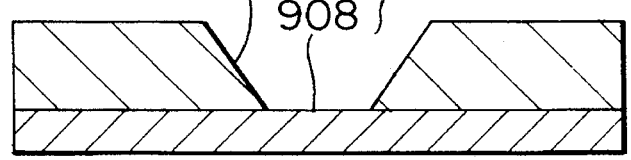
Figure 9G:
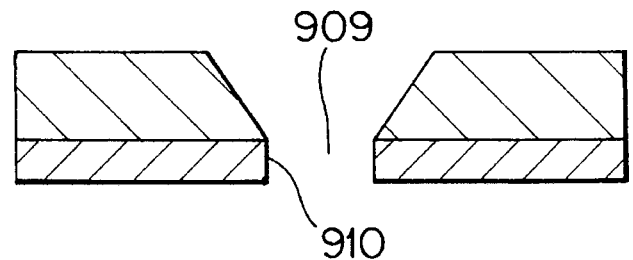
Figure 10A:
FIGS. 10(a) through 10(g) are sectional views of a process in the case where a nozzle which has an inclined plane/a vertical plane/an inclined plane is manufactured by applying the method of manufacturing the nozzle in FIG. 9.
Figure 10B:
Figure 10C:
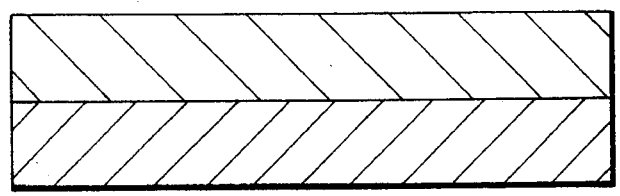
Figure 10D:
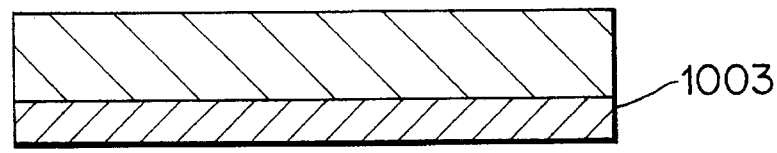
Figure 10E:
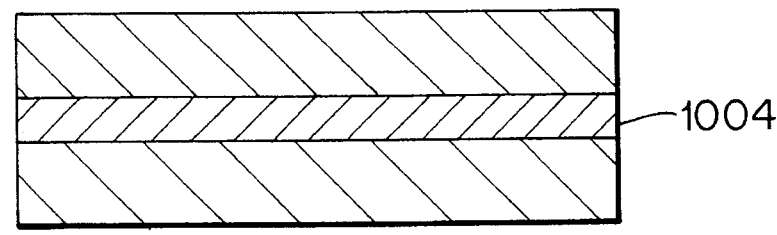
Figure 10F:
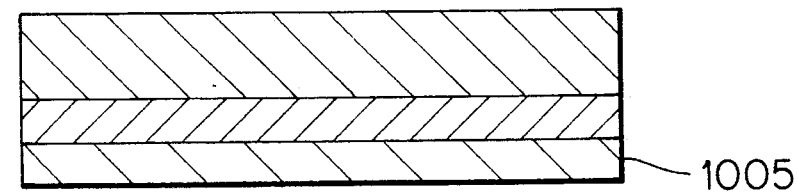
Figure 10G:
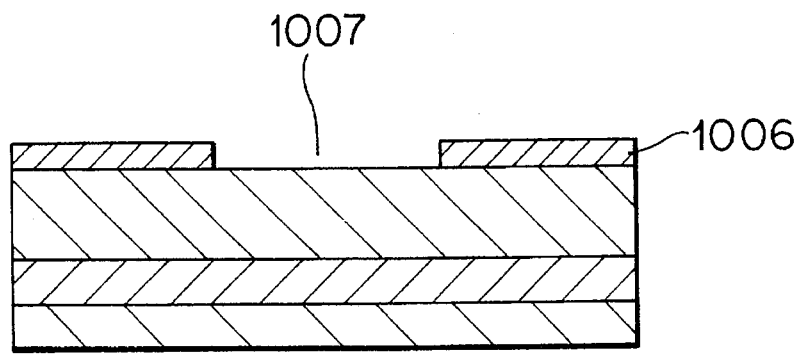
Figure 10H:
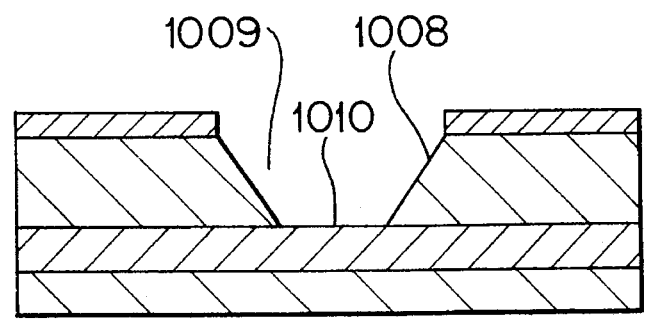
Figure 10I:
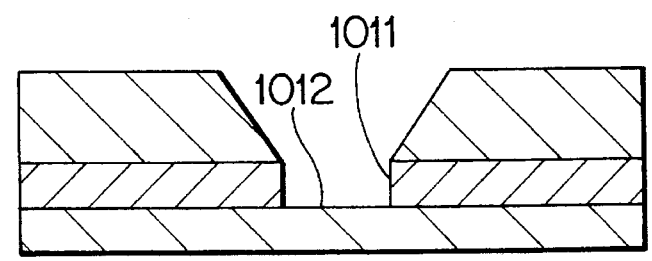
Figure 10J:
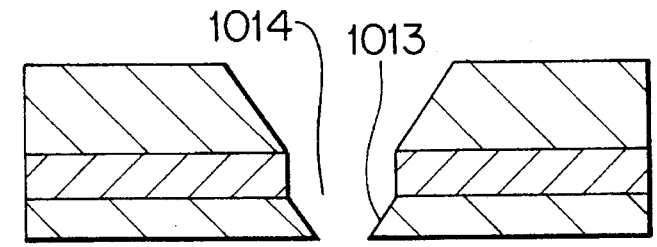
Figure 11A:
FIGS. 11(a) through 11(g) are sectional views of a process in the case where a nozzle which has a vertical plane and an inclined plane is manufactured.
Figure 11B:
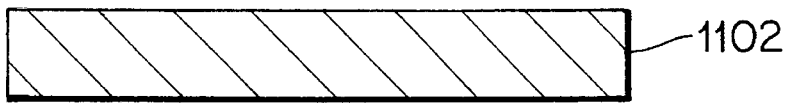
Figure 11C:
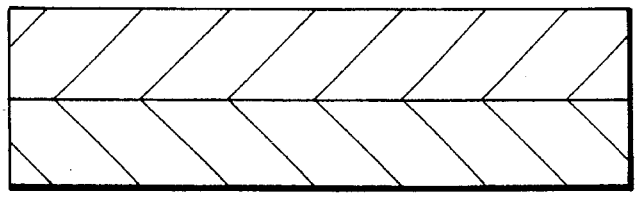
Figure 11D:
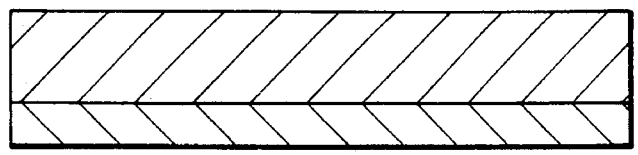
Figure 11E:
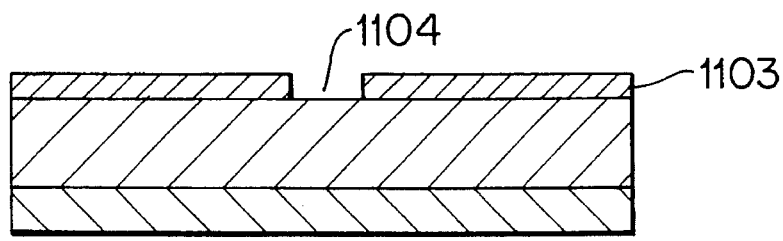
Figure 11F:
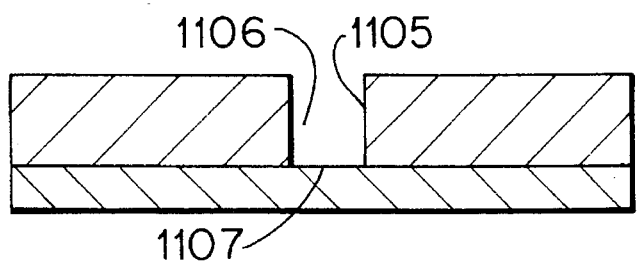
Figure 11G:
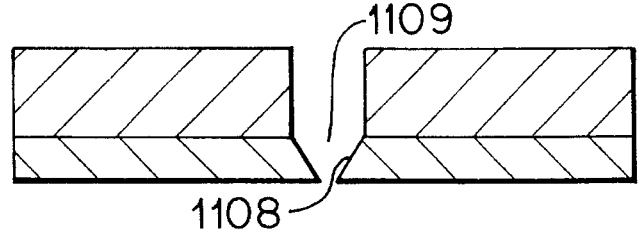
Figure 12A:
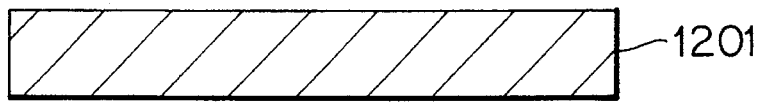
FIGS. 12(a) through 12(j) are sectional views of a process in the case where a nozzle having a vertical plane/an inclined plane/a vertical plane is manufactured by applying the nozzle manufacturing method of FIG. 11.
Figure 12B:
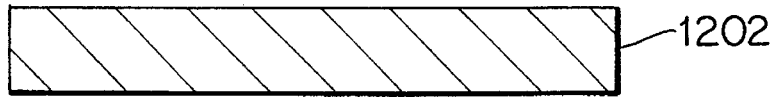
Figure 12C:
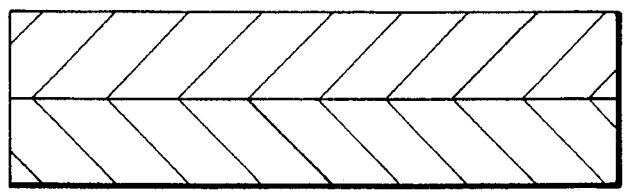
Figure 12D:
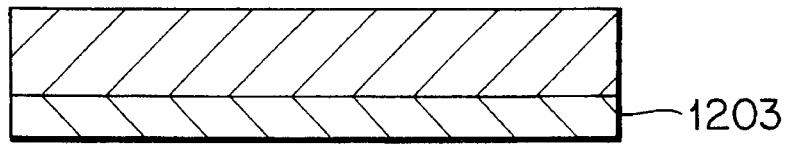
Figure 12E:
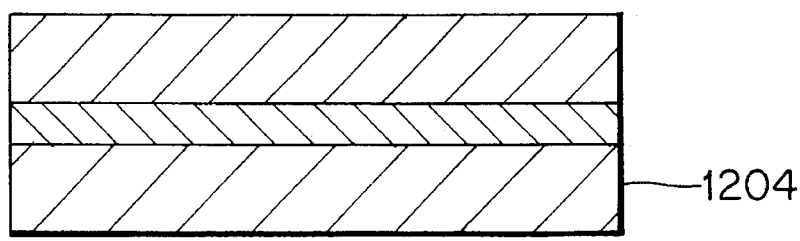
Figure 12F:
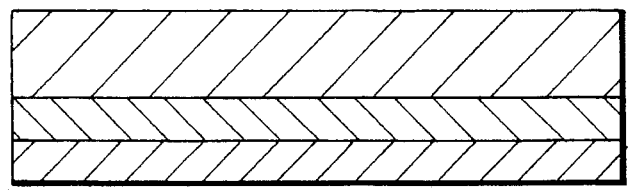
Figure 12G:
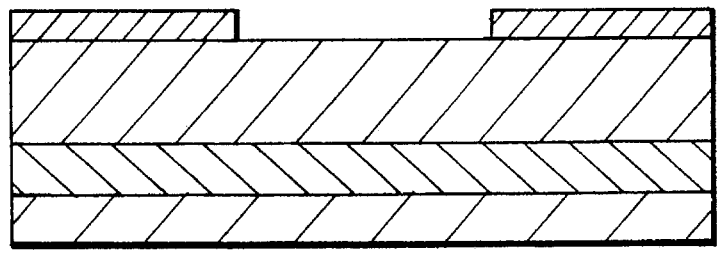
Figure 12H:
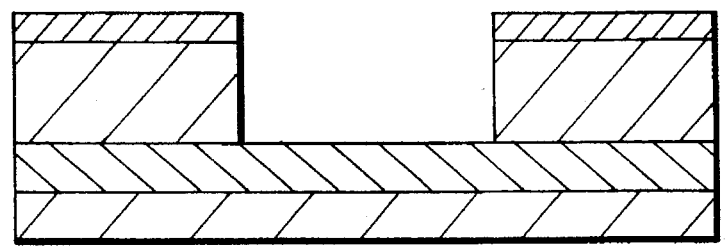
Figure 12I:
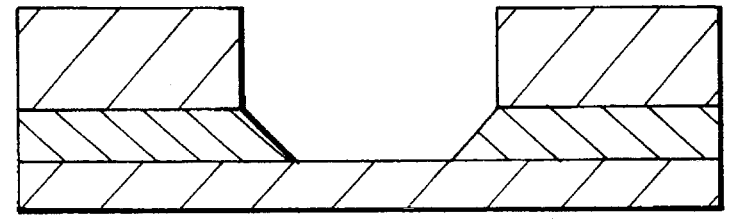
Figure 12J:
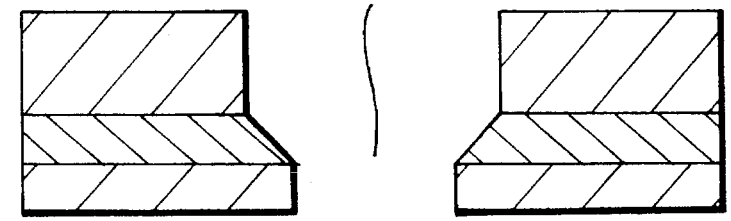
Figure 13A:
FIGS. 13(a) through 13(f) are sectional views of a process in the case where a diaphragm is manufactured in bonded substrates crystallized in a different direction.
Figure 13B:
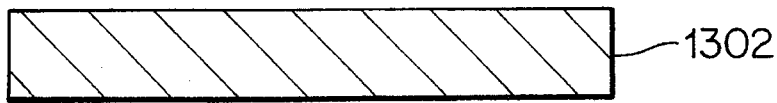
Figure 13C:
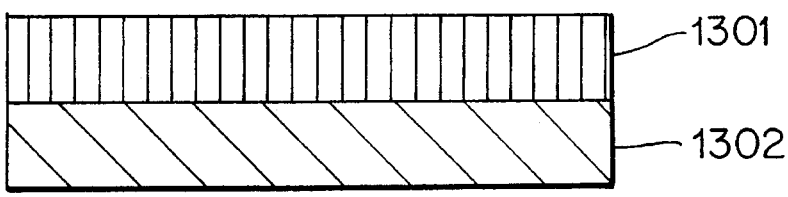
Figure 13D:
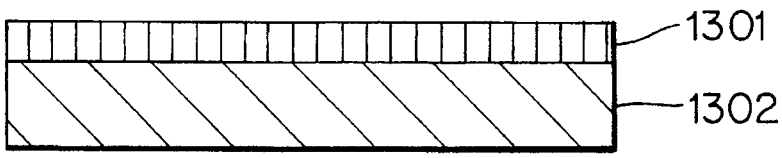
Figure 13E:
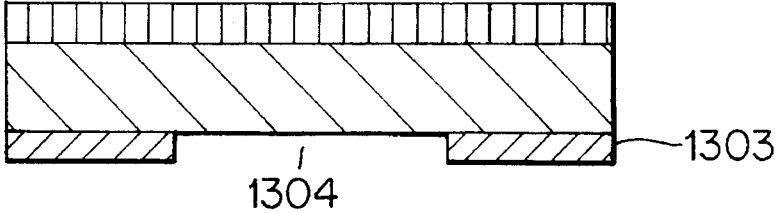
Figure 13F:
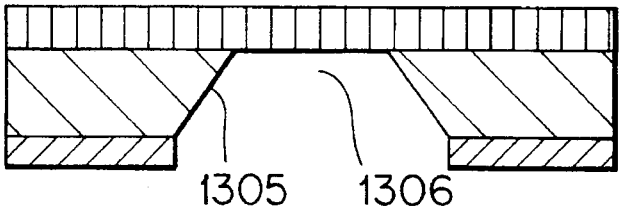
Figure 14A:
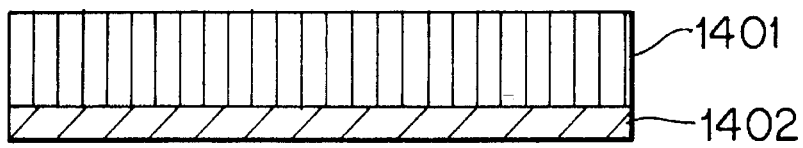
FIGS. 14(a) through 14(f) are sectional views of a process in the case where a diaphragm is manufactured by utilizing a difference in the concentration of an impurity in bonded substrates crystallized in a different direction with an epitaxial layer interposed therein.
Figure 14B:
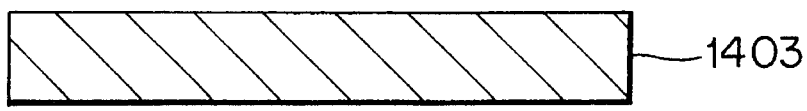
Figure 14C:
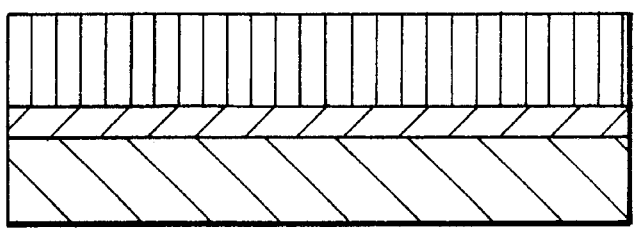
Figure 14D:
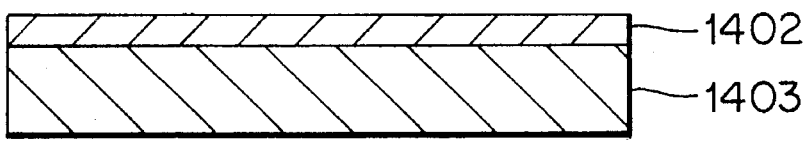
Figure 14E:
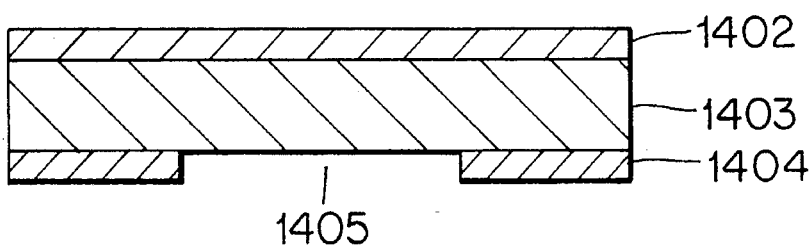
Figure 14F:
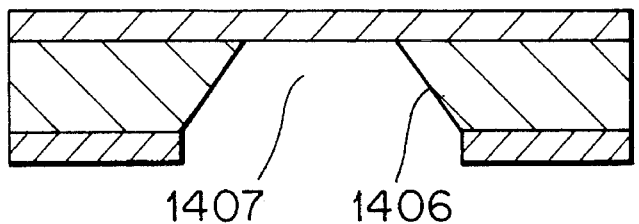

Next, when a substrate (710) is bonded to the flattened deposited layer (707) and the <410> substrate (701) is removed as shown in FIG. 7(f), an optical divider having an optical reflective surface (711) is manufactured as shown in of FIG. 7(g).

There are two methods for removing the <410> substrate (701). The first method is that when the bonded substrate (710) is used as a <111> substrate and anisotropically etched without an etching protective mask, the <410> substrate (701) is etched faster than the <111> bonded substrate (710), and so the <410> substrate (710) can be removed completely. The second method is that when the <410> substrate (701) is formed from a p⁺ substrate and the bonded substrate (710> from a low concentration p⁻ substrate irrespective of the direction of crystallization and they are etched by means of a mixed solution of fluoric acid-nitric acid-acetic acid (1-3-8), the p<410> substrate (710) can be removed selectively.

FIG. 8 is a sectional view showing a process of manufacturing an optical divider which can change the distance between optical reflective surfaces and a substrate at its discretion by positioning it at the end of a pillar.

After a <110> substrate (801) like (a) of FIG. 8 and a <410> substrate (802) like (b) of FIG. 8 are bonded and one substrate is etched, it is made to act as an etching protective mask of the other substrate (refer to (c) of FIG. 8). An etching protective film (804) is formed an the surface of the substrate (801) and an etching window (805) is made therein (refer to (d) of FIG. 8). For instance, when the <110> substrate (801) is etched by means of a solution of KOH, the side is no layer etched by reason that a <111> surface (807) is exposed, and etching proceeds in a direction vertical to the surface as shown in (e) of FIG. 8.

A space (806) formed herein becomes a pillar of the optical divider, and so the thickness of the substrate (801) corresponds to the height of the pillar. The bottom (808) after etching of the <110> substrate (801) is finished acts as an etching window of the lower substrate (802). When etching continues, the <410> substrate (802) is etched but etching does not proceed to its side (810) and the sectional area of etching continues to decrease, forming a pyramidal etching hole (809) (refer to (f) of FIG. 8 ). Consequently, the surface of <410> substrate (802) forms an angle of 45.56 ° with the etching side (810) and each surface which forms a pyramid becomes an optical reflective surface. In order to improve reflexibility of the optical reflective surface, a proper optical reflective material (811) is applied thereto and, to fill up an etching hole (809), a deposited layer (812) is formed from polycrystallized silicon or an oxidized film as shown in (g) of FIG. 8 and a surface (813) flattened for bonding of substrates by polishing is formed (refer to (h) of FIG. 8).

When a substrate (814) is bonded to a flat surface (815) as shown in (i) of FIG. 8, and the <410> substrate (802) is removed and then the <110> substrate (801) is removed subsequently as shown in (j) of FIG. 8, an optical divider which has an optical reflective surface (816) and pillar structure is formed (refer to (k) of FIG. 8).

The optical divider manufactured according to those processes mentioned above separates one optical signal in each direction by reflecting it in several optical reflective surfaces. particularly, when the optical reflective surface forms an angle of 45° with the substrate, an optical signal which comes into the substrate vertically is separated in each direction and proceeds in parallel with the substrate.

At this time, the optical signal is separated by adjusting an angle between the optical reflective surface and the substrate and it can be made to proceed at any angle formed with the substrate. The distance between the optical signal divided in the optical reflective surface and the substrate can also be changed by manufacturing the optical reflective surface on the pillar. The seemed embodiment of this invention relates to a method of manufacturing variously shaped nozzles through a single photo transferring process by bonding those substrates which are different in the direction of crystallization and anisotropically etching them.

This embodiment is based on utilizing that the KOH or EDP solution effects anisotropic etching different in etching characteristic according to the direction of crystallization of a silicon substrate. Even if the same etching protective film is formed, the shapes into which <100> substrate and <110> substrate are etched are different. When a quadrilateral window is made in the etching protective film and <100> substrate is etched by the KOH solution, the substrate is etched in the form of a pyramid. When <110> substrate is etched, it is etched in the form of a quadrilateral pillar perpendicular to the surface thereof. If <100> substrate and <110> substrate are etched after being bonded, the substrate etched earlier is used as an etching protective mask of the next etching substrate, and so a form in which pyramidal and quadrilateral pillar structures are laid over can be obtained by one mask, wherein the sectional area of an etched part is easily adjustable if the thickness of an etched layer is changed.

FIG. 9 is a sectional view of a process in the case where a nozzle (909) having a thickness which becomes narrower but becomes uniform toward the end is manufactured by using the etching-finished <100> substrate as an etching protective mask of the <110> substrate.

In the first place, a <100> substrate (901) like (a) of FIG. 9 and a <110> substrate (902) like (b) of FIG. 9 are bonded and the <110> substrate (902) is made into a thin film to a proper thickness (refer to (c) (d) of FIG. 9).

When a substrate (901) is anisotropically etched by means of KOH or EDP solution after an etching protective mask (904) is formed on one surface thereof and an etching window (905) is made therein, etching is controlled with a <111> side wall appearing in the substrate (901) and it is formed into a pyramid (906) with its upper part cut (refer to (e) (f) of FIG. 6).

The quadrilateral bottom (908) formed after the substrate (901) is etched is regarded as an etching window without an etching protective film in the process where the substrate (902) is etched, and the remaining range is regarded as a range wherein etching protective film is formed.

So, if etching continues, etching does not proceed in the substrate (901) with the <111> surface being exposed and in the other part of a substrate (903) and etching proceeds with <111> surface (910) being exposed vertically to the surface of the substrate only in the substrate (903) located under the quadrilateral bottom (908) (refer to (g) of FIG. 9), wherein the <100> substrate (901) changes the size of the bottom (908) etching of which is finished according to thickness even in the same etching window (905) and this quadrilateral bottom (908) controls the size of a nozzle. Therefore, the size of the nozzle is determined by the thickness of the etching window (905) and substrate (901).

FIG. 10 is a sectional view of a process in the case where a nozzle having an inclined plane/a vertical plane/an inclined plane is manufactured by applying the method of manufacturing the nozzle in FIG. 9. In the first place, after a <100> substrate (1001) and a <110> substrate (1002) are bonded, the substrate (1002) is made into a thin film (refer to (a)-(d) of FIG. 10) and, after the surface (1004) of a substrate (1003) made into a thin film is mirror polished, a substrate (1005) is made into a thin film by bonding the <100> substrate (1005) thereto (refer to (e) (F) of FIG. 10).

When the substrate (1001) is anisotropically etched by means of KOH or EDP solution after an etching protective mask (1006) is bonded on one surface thereof and an etching window (1007) is made therein, etching is controlled with a <111> direction side wall (1008) appearing in the substrate (1001) and it is formed into a pyramid (1009) with its upper part cut (refer to (g) and (h) of FIG. 10).

When etching is continued by regarding a quadrilateral bottom (1010) formed after the substrate (1001) is etched as an etching window when the substrate (1002) is etched, etching proceeds with the <111> bottom (1011) being exposed vertically to the surface of the substrate only in the substrate (1003) located under said bottom (1010) (refer to (i) of FIG. 10).

When etching is continued by regarding a quadrilateral bottom (1012) formed after the substrate (1002) is etched as an etching window, etching is controlled with a <111> side wall (1013) appearing only in the substrate (1005) located under said bottom (1012) and it is formed into a pyramid (1014) with its upper part cut (refer to (j) of FIG. 10)

Therefore, a nozzle which becomes narrow again after being narrow and uniform in width can be manufactured, and one transferring process for manufacturing the first etching window is enough and the remaining etching window is made possible by its own mask process.

FIG. 11 is a sectional view of a process in the case where a nozzle which is uniform in width but becomes narrow toward the end is manufactured by using the etching-finished <110> substrate as an etching protective mask of the <100> substrate in contrast with FIG. 9.

After a <110> substrate (1101) and a <100> substrate (1102) are bonded, the <100> substrate (1102) is made into a thin film (refer to (a)-(d) of FIG. 11), and an etching protective film (1103) is formed on one surface of the substrate (1101) and an etching window (1104) is made therein (refer to (e) of FIG. 11). When it is anisotropically etched by the KOH or EDP solution, etching proceeds with a <111> surface (1105) appearing vertically to the surface thereof (refer to (f) of FIG. 11). When etching is continued by regarding a quadrilateral bottom (1107) formed after the substrate (1101) is etched in the form of a quadrilateral pillar (1106) as an etching window, etching is controlled with a <111> side wall (1108) appearing only in the substrate (1102) located under said bottom (1107) and it is made into a pyramid (1109) with its upper part cut (refer to (g) of FIG. 11).

FIG. 12 is a sectional view of a process in the case where a nozzle having a vertical plane/an inclined plane/a vertical plane is manufactured by applying the nozzle manufacturing method of FIG. 11. Each process illustrated in (a)-(j) of FIG. 12 is the same as those illustrated in FIG. 11.

Merely and simply, a nozzle (1205) which is again uniform in width toward the end after being uniform and narrow is manufactured by bonding a <110> substrate (1201) and a <100> substrate (1201) for a start and bonding again a <110> substrate (1204) to a substrate (1203) made into a thin film.

When those substrates different in the direction of crystallization are bonded and etched, variously shaped nozzles can be manufactured according to the number of substrates to be etched.

The third embodiment of the present invention relates to a method of manufacturing a diaphragm uniform in thickness in a wide area by utilizing different substrate bonding technique and selective anisotropic etching technique.

FIG. 13 is a sectional view of a process in the case where a diaphragm is manufactured in bonded substrates crystallized in a different direction. After a <111> substrate (1301) like (a) of FIG. 13 and a <100> substrate (1302) like (b) of FIG. 13 are bonded (refer to (c) of FIG. 13), the <111> substrate (1301) is made into a thin film (refer to (d) of FIG. 13), and an etching protective mask (1303) is formed on one surface of the substrate (1302) and an etching window (1304) is made therein (refer to (e) of FIG. 13).

When the substrate (1302) is anisotropically etched by the KOH or EDP solution, etching is controlled by the appearance of a side wall (1305) and it is formed into a pyramid (1306) with its upper part cut. Even if the <111> substrate (1301) is exposed, etching does not proceed in the <111> surface, and so etching comes to a stop automatically (refer to (f) of FIG. 13).

Since a process of making the <111> substrate (1301) into a thin film in FIG. 13 depends largely on polishing, the thickness of a diaphragm can be made ununiform.

FIG. 14 is a sectional view of a process in the case where a diaphragm is manufactured by utilizing a difference in the concentration of an impurity in bonded substrates different in the direction of crystallization with an epitaxial layer interposed. A <111> substrate (1401) wherein a p-epitaxial layer (1402) is grown up like (a) of FIG. 14, and a <100> p-substrate (1403) like (b) of FIG. 14 are bonded with the p-epitaxial layer (1402) interposed therebetween (refer to c of FIG. 14).

The p+ substrate (1401) is selectively removed from said bonded substrates by a difference in the concentration of a mixed solution of fluoric acid—nitric acid—acetic acid, and an etching protective film (1404) is formed in the <100> substrate and an etching window (1405) is made therein (refer to (d)(e) of FIG. 14).

When the <100> substrate (1403) is etched anisotropically, a sectional area is reduced by the appearance of a side wall (1406) and it is formed into a pyramid (1407) with its upper part cut.

Even if the <111> substrate (1402) is exposed, etching does not proceed in the <111> surface, and so etching comes to a stop automatically (refer to (f) of FIG. 14).

As heretofore described, the present invention can manufacture those microstructure which shorten a photograph transferring process but function mechanically by uniting the same or different substrate bonding technique and selective anisotropic etching technique.

In particular, this invention can easily manufacture not only an optical divider and a nozzle which are miniaturized and excellent in the accuracy of a position and reproducibility of a shape but also a thin diaphragm to a uniform thickness in a wide area .

When microstructure are manufactured, each part is manufactured in consecutive order by using the bonded substrates in which more than two substrates are bonded, and so the present invention has the effect of preventing those microstructure from being transformed and damaged by eliminating a parts-uniting process.

What is claimed is :

1. The method of manufacturing a microstructure by the anisotropic etching and bonding of substrates, comprising the following steps:

bonding a first substrate with a second substrate that has a different crystal orientation from the first substrate;

polishing the second substrate, the second substrate being thinner than the first substrate after the polishing step;

forming an etching protective mask on the first substrate;

forming a window in the etching protective mask so as to permit exposure of a region of the first substrate by using photolithography;

etching the first substrate exposed through the window so as to form nozzles that are different from each other.

2. The method of manufacturing the microstructure as claimed in claim 1 wherein the size of the nozzles is determined by the window size and the thickness of the first substrate.

3. The method of manufacturing a microstructure as claimed in claim 1 wherein the first substrate has a <100> crystal orientation and the second substrate has a <110> crystal orientation, and the nozzles have an inclined plane and a vertical plane.

4. The method of manufacturing a microstructure as claimed in claim 1 wherein the first substrate has a <110> crystal orientation and the second substrate has a <100> crystal orientation.

5. The method of manufacturing a microstructure as claimed in claim 1 wherein further comprising the steps of polishing a surface of a third substrate to be a thin film after bonding, said third substrate having a <100> crystal orientation to the second substrate.

6. The method of manufacturing a microstructure as claimed in claim 1 and further comprising the steps of etching the third substrate, thereby formed nozzles which have a lateral surface of inclined plane/vertical plane/inclined plane to a bottom thereof from an upper portion thereof.

7. The method of manufacturing a microstructure as claimed in claim 1 wherein the crystal orientation of the first substrate is <110>, and the crystal orientation of the second substrate is 100 and further comprising a third substrate having a crystal orientation that is <110>, and wherein the nozzles have a vertical/inclined/vertical plane.

8. A method of manufacturing a microstructure by the anisotropic etching and bonding of substrates, comprising the steps of:

forming an etching protective mask on a first substrate;

forming a window to expose a region of the first substrate by photolithography techniques;

etching the exposed first substrate through the window so as to make a hole which has a specified shape and a depth by using an etching solution;

removing the remaining etching protective mask on the first substrate;

forming a reflective layer on the entire surface of the first substrate to improve the reflectivity;

depositing a deposited layer having a flat surface on the reflective layer; and removing the first substrate to make an optical divider having several optical reflective surfaces after bonding a second substrate on the surface of the deposited layer.

9. The method of manufacturing a microstructure as claimed in claim 8, wherein the height of the optical coupler is determined by the depth of the holes.

10. The method of manufacturing a microstructure as claimed in claim 8 wherein the number of the optical reflective surfaces and an angle formed by the optical reflective surfaces with the substrate are determined by an etching solution and the crystal orientation of the first substrate.

11. The method of manufacturing the microstructure as claimed in claim 8 wherein the first substrate having a <410> crystal orientation and the second substrate having a <111> crystal orientation.

12. The method of manufacturing the microstructure as claimed in claim 8, wherein said deposited layer is a polycrystalline or a silicon oxide.

13. The method of manufacturing the microstructure as claimed in claim 8 wherein the first substrate is faster etched than the second substrate, and the second substrate is not coated with an etching protective mask.

14. The method of manufacturing the microstructure as claimed in claim 13, wherein the step of removing the first substrate is performed by using a mixed solution of fluoric acid-nitride acid-acetic acid (1-3-8 mol %).

15. The method of manufacturing the microstructure as claimed in claim 8, further comprising the step of bonding a third substrate having a <110> crystal orientation on the opposite surface of the first substrate before etching the exposed first substrate in order to form a V-groove therein.

16. The method of manufacturing the microstructure as claimed in claim 15 wherein the third substrate acts as an etch stopper when etching the first substrate so as to form the V-groove thereof.

17. The method of manufacturing a microstructure as claimed in claim 5, wherein the third substrate acts as an etch stopper.

* * * * *